(12) United States Patent
Cheng

(10) Patent No.: US 12,002,735 B2
(45) Date of Patent: Jun. 4, 2024

(54) SEMICONDUCTOR PACKAGE

(71) Applicant: Tien-Chien Cheng, HsinChu (TW)

(72) Inventor: Tien-Chien Cheng, HsinChu (TW)

( * ) Notice: Subject to any disclaimer, the term of this patent is extended or adjusted under 35 U.S.C. 154(b) by 238 days.

(21) Appl. No.: 17/469,698

(22) Filed: Sep. 8, 2021

(65) Prior Publication Data

US 2021/0407886 A1    Dec. 30, 2021

Related U.S. Application Data

(63) Continuation-in-part of application No. 16/695,190, filed on Nov. 26, 2019, now abandoned.

(60) Provisional application No. 62/780,932, filed on Dec. 18, 2018.

(51) Int. Cl.
| | |
|---|---|
| *H01L 23/42* | (2006.01) |
| *H01L 23/00* | (2006.01) |
| *H01L 23/48* | (2006.01) |

(52) U.S. Cl.
CPC ............ *H01L 23/42* (2013.01); *H01L 23/481* (2013.01); *H01L 24/16* (2013.01); *H01L 2224/16221* (2013.01); *H01L 2924/16151* (2013.01); *H01L 2924/1616* (2013.01); *H01L 2924/16251* (2013.01); *H01L 2924/1632* (2013.01)

(58) Field of Classification Search
CPC ....... H01L 23/42; H01L 23/481; H01L 24/16; H01L 2224/16221; H01L 2229/16151; H01L 2229/1616; H01L 2229/16251; H01L 2229/1632
See application file for complete search history.

(56) References Cited

U.S. PATENT DOCUMENTS

| | | | | |
|---|---|---|---|---|
| 9,220,183 | B1* | 12/2015 | Buvid | ............... H01L 23/44 |
| 2012/0162836 | A1* | 6/2012 | Furuta | ............... H01L 23/62 |
| | | | | 327/427 |
| 2014/0016270 | A1* | 1/2014 | Bonkohara | ........ H05K 7/20218 |
| | | | | 361/699 |

* cited by examiner

*Primary Examiner* — Peniel M Gumedzoe
(74) *Attorney, Agent, or Firm* — Chun-Ming Shih; LANWAY IPR SERVICES

(57) ABSTRACT

A semiconductor package is disclosed for efficiently facilitating heat dissipation. The semiconductor package includes a substrate layer, a chip, a housing lid and thermal-conductive liquid. A chip is disposed on the substrate layer and electrically coupled to the substrate layer. The chip includes at least one through silicon via (TSV). The housing lid is disposed above both the substrate layer and the chip. Also, the housing lid is coupled to the substrate layer at its edge for forming an internal space that encompasses the chip. The thermal-conductive liquid is filled within the internal space.

20 Claims, 14 Drawing Sheets

SEMICONDUCTOR PACKAGE

CROSS REFERENCE TO RELATED APPLICATION

This application is a continuation-in-part application of U.S. Non-Provisional patent application Ser. No. 16/695,190, filed on Nov. 26, 2019 and entitled "SEMICONDUCTOR AND FABRICATING METHOD THEREOF", which is incorporated by reference herein in its entirety.

BACKGROUND OF THE INVENTION

1. Field of the Invention

The present invention relates to a semiconductor package, and more particularly, to a semiconductor package that improves heat dissipation.

2. Description of the Prior Art

A conventional semiconductor package typically has weak heat dissipation. Therefore, such conventional semiconductor package is vulnerable to concentrated heat and malfunctions consequently. Such heat concentration easily occurs during the fabrication process of the conventional semiconductor package. For preventing damages to the conventional semiconductor package caused by heat, such heat concentration is required to be removed or neutralized.

SUMMARY OF THE INVENTION

The present disclosure aims at disclosing a semiconductor package for efficiently facilitating heat dissipation.
In a first example, the semiconductor package includes a substrate layer, a chip, a housing lid and thermal-conductive liquid. A chip is disposed on the substrate layer and electrically coupled to the substrate layer. The chip includes at least one through silicon via (TSV). The housing lid is disposed above both the substrate layer and the chip. Also, the housing lid is coupled to the substrate layer at its edge for forming an internal space that encompasses the chip. The thermal-conductive liquid is filled within the internal space.

In one example, the at least one TSV partially penetrates the chip.

In one example, the at least one TSV entirely penetrates the chip.

In one example, two of the at least one TSV form a pipe that embeds within the chip. And the two TSVs are substantially connected to each other.

In one example, the semiconductor package also includes at least one microchannel that is disposed between two of the at least one TSV on the surface of the chip.

In one example, the thermal-conductive liquid comprises CFC.

In one example, the housing lid includes a plurality of holes that penetrate the housing lid. In turn, the plurality of holes allow the thermal conductive liquid to flow into or flow out of the internal space.

In one example, the semiconductor package also includes a plurality of plugs that block the plurality of holes for sealing the thermal conductive liquid within the internal space.

In one example, the plurality of plugs include a plurality of screws, the plurality of holes includes a plurality of lateral threads, and the plurality of screws detachably engage with the plurality of lateral threads for blocking the inlet hole.

In one example, the housing lid further includes at least one cycling pipe that connects a pair of the plurality of holes at an external side of the semiconductor package.

In one example, the semiconductor package also includes an adhesive layer that is disposed between the housing lid and the substrate layer. In addition, the adhesive layer substantially contacts both the housing lid and the substrate layer for adhering the housing lid with the substrate layer.

In one example, the substrate layer further includes a plurality of solder bumps that are disposed between the substrate layer and an external printed circuit board (PCB). Such that the substrate layer is electrically coupled to the external PCB via the plurality of solder bumps.

In one example, the substrate layer additionally includes a plurality of solder bumps that are sandwiched between the substrate layer and the chip. Such that the chip is electrically coupled to the substrate layer via the plurality of solder bumps.

In a second example, the semiconductor package includes a substrate layer, a chip, a housing lid, and a metal mesh. The chip is disposed on the substrate layer and electrically coupled to the substrate layer. The housing lid is disposed above both the substrate layer and the chip. Moreover, the housing lid is coupled to the substrate layer at its edge for forming an internal space that encompasses the chip. And the metal mesh is disposed on the surface of the chip and within the internal space.

In one example, the metal mesh is made of copper.

In one example, the metal mesh is made of stainless steel.

In one example, the housing lid includes at least two holes and at least one cycling pipe. The at least two holes substantially penetrate the housing lid. And the at least one cycling pipe connects a pair of the at least two holes at an external side of the semiconductor package.

In one example, the thermal-conductive liquid includes CFC.

In one example, the semiconductor package also includes an adhesive layer that disposed between the housing lid and the substrate layer. Besides, the adhesive layer substantially contacts both the housing lid and the substrate layer for adhering the housing lid with the substrate layer.

In one example, the substrate layer additionally includes a plurality of solder bumps that are disposed between the substrate layer and an external printed circuit board (PCB). Such that the substrate layer is electrically coupled to the external PCB via the plurality of solder bumps.

In one example, the substrate layer also includes a plurality of solder bumps that are sandwiched between the substrate layer and the chip. Such that the chip is electrically coupled to the substrate layer via the plurality of solder bumps.

In a third example, the semiconductor package includes a substrate layer, a chip and a housing lid. The chip is disposed on the substrate layer and electrically coupled to the substrate layer. Besides, the housing lid is disposed above both the substrate layer and the chip. And the housing lid is coupled to the substrate layer at its edge for forming an internal space that encompasses the chip. Specifically, the housing lid includes at least two holes and at least one cycling pipe. The at least two holes substantially penetrate the housing lid. And at least one cycling pipe connects a pair of the at least two holes at an external side of the semiconductor package.

In one example, the thermal-conductive liquid includes CFC.

In one example, the semiconductor package additionally includes an adhesive layer that is disposed between the housing lid and the substrate layer. Besides, the adhesive layer substantially contacts both the housing lid and the substrate layer for adhering the housing lid with the substrate layer.

In one example, the substrate layer additionally includes a plurality of solder bumps that are disposed between the substrate layer and an external printed circuit board (PCB). Such that the substrate layer is electrically coupled to the external PCB via the plurality of solder bumps.

In one example, the substrate layer also includes a plurality of solder bumps that are sandwiched between the substrate layer and the chip. Such that the chip is electrically coupled to the substrate layer via the plurality of solder bumps.

These and other objectives of the present invention will no doubt become obvious to those of ordinary skill in the art after reading the following detailed description of the preferred embodiment that is illustrated in the various figures and drawings.

DETAILED DESCRIPTION

As mentioned above, the present disclosure discloses a semiconductor package that can improve heat dissipation. In this way, the semiconductor package can be substantially prevented from being damaged by over-concentrated heat during its fabrication process.

Figure 1:
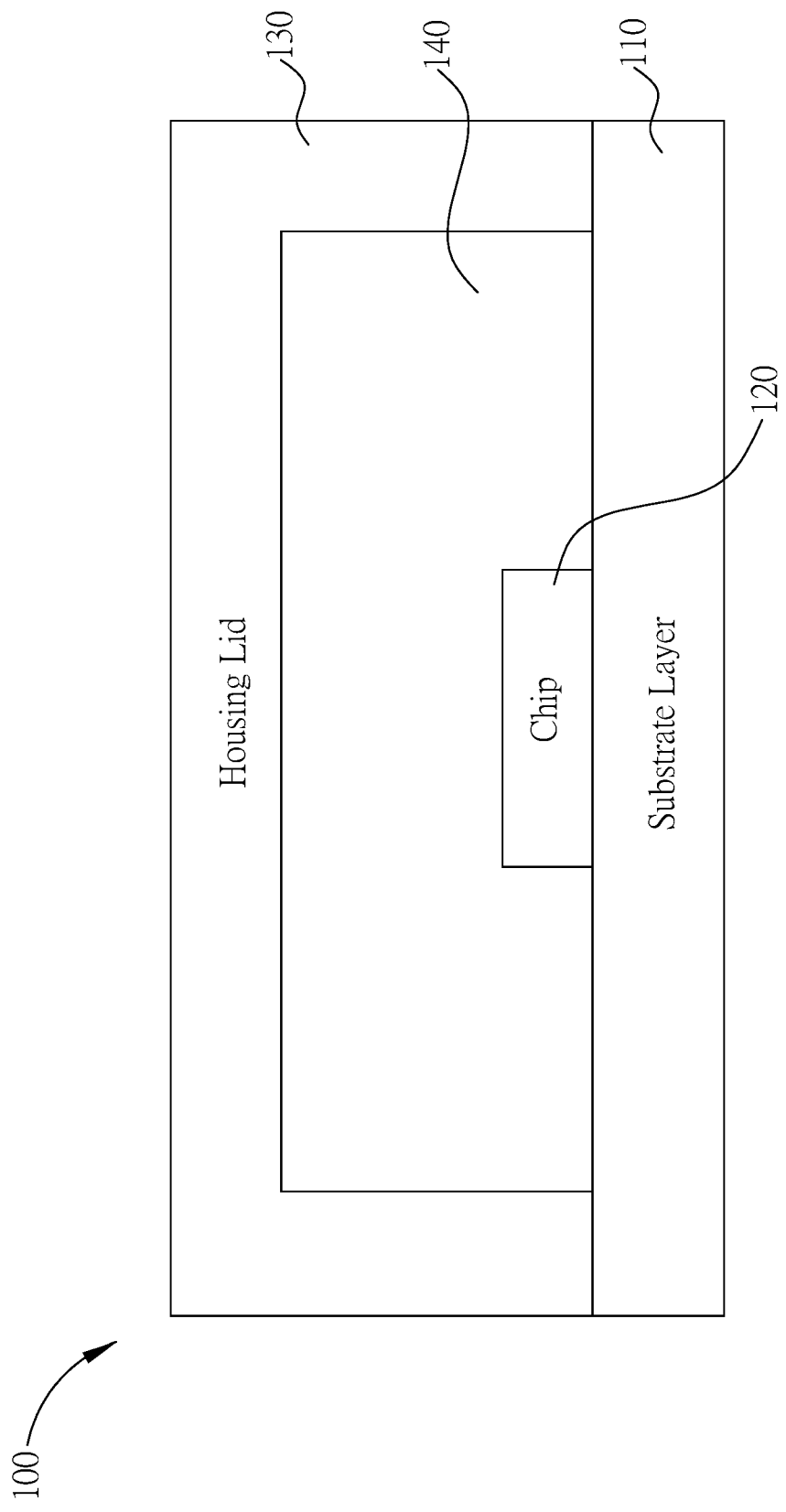
FIG. 1 illustrates a semiconductor package according to one embodiment of the present disclosure.

FIG. 1 illustrates a semiconductor package 100 according to a first embodiment of the present disclosure. The semiconductor package 100 includes a substrate layer 110, a chip 120, and a housing lid 130.

The chip 120 is disposed on the substrate layer 110. Also, the chip 120 is electrically coupled to the substrate layer 110. Additionally, the chip 120's area is smaller than that of the substrate layer 110. Such that in some examples, there are multiple chips 120 disposed on the substrate layer 110.

The housing lid 130 is disposed above the chip 120. Also, the housing lid 130 is coupled to the substrate layer 110 at its edge for forming an internal space 140 that encompasses the chip 120. Consequently, the housing lid 130 covers the chip 120 and the substrate layer 110 from their top side. On top of that, in some examples, the internal space 140 is filled with a liquid-form thermal interface material (TIM). Such liquid-form TIM flows inside the semiconductor package 100 while fabricating the semiconductor package 100. In this way, heat inside the semiconductor package 100 can be dissipated external to the semiconductor package 100 for preventing the semiconductor package 100 from being damaged by concentrated heat.

In some examples, the TIM include a heat conductive liquid. In some other examples, the heat conductive liquid may include a silicon oil, a thermal grease, a thermal gel, a phase change liquid material, and/or a thermal conductive adhesive. The abovementioned exemplary materials for implementing the TIM are qualified for efficiently dissipating heat from a highly concentrated heat source within the semiconductor package 100. In some examples, the liquid-form TIM's thermal conductivity exceeds 10 W/(cm*K) or even 150 W/(cm*K), depending on the semiconductor packages 110's different heat-dissipating requirements.

Figure 2:
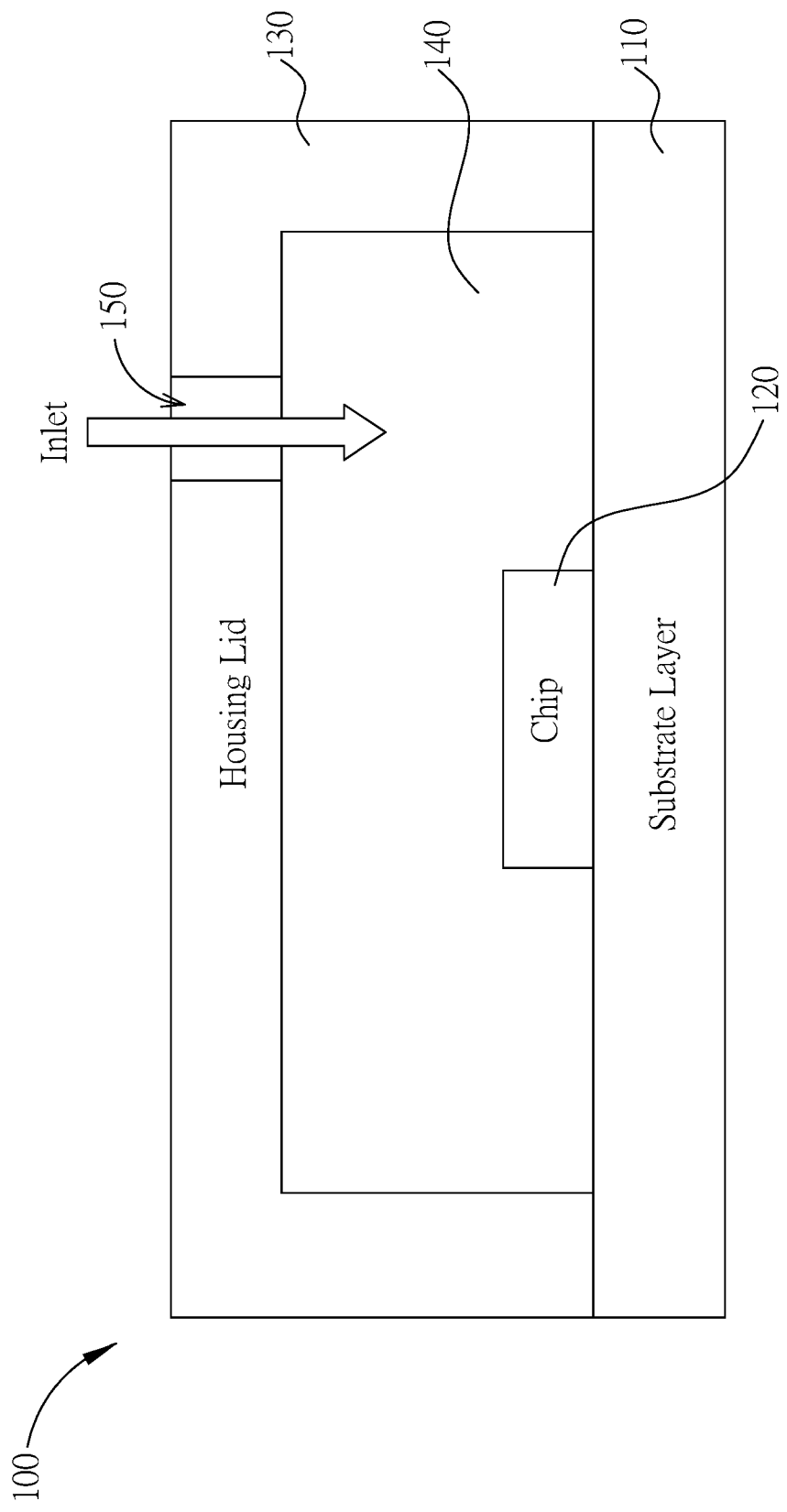
FIG. 2 illustrates at least one inlet hole disposed on a housing lid shown in FIG. 1.
Figure 3:
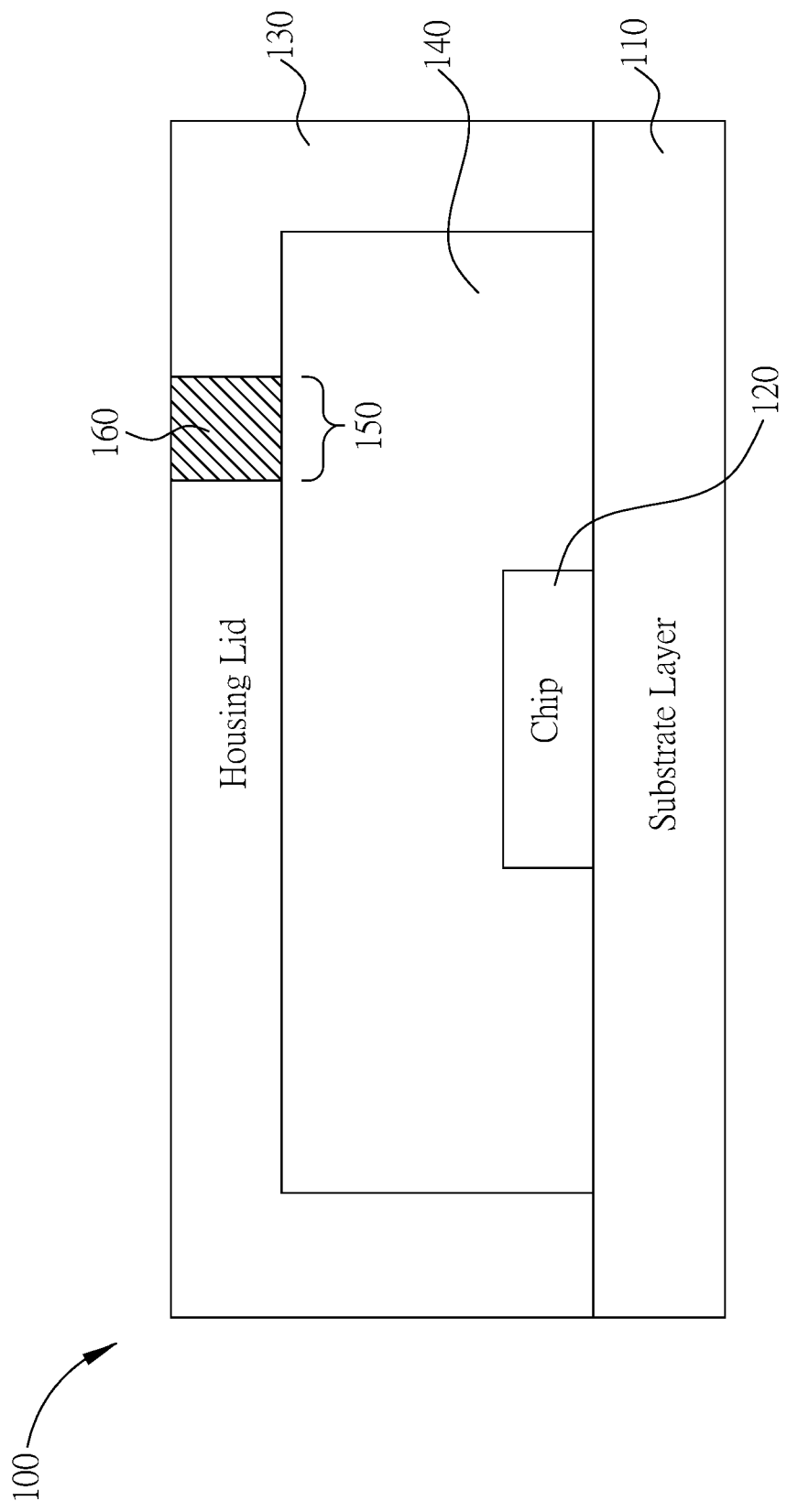
FIG. 3 illustrates at least one inlet plug used for blocking the at least one inlet hole shown in FIG. 2.

In some examples, the housing lid 130 includes an inlet hole 150 for receiving the liquid-form TIM, as illustrated in FIG. 2. In this way, the liquid-form TIM is allowed to flow into the internal space 140. Also, in some examples, the semiconductor package 100 further includes an inlet plug 160 for sealing the liquid-form TIM inside the internal space 140, as illustrated in FIG. 3. Also, external liquid-form TIM is stopped by the inlet plug 160 from being flowing into the inlet hole 150.

In some other examples, the inlet plug 160 is implemented using a screw. In addition, the inlet hole 150 further includes a lateral thread for receiving the screw. Such that the screw is detachably engaged with the lateral thread for blocking the inlet hole 150. Similarly, the screw blocks the liquid-form TIM within the internal space 140 and stops external liquid-form TIM from flowing into the inlet hole 150.

Figure 4:
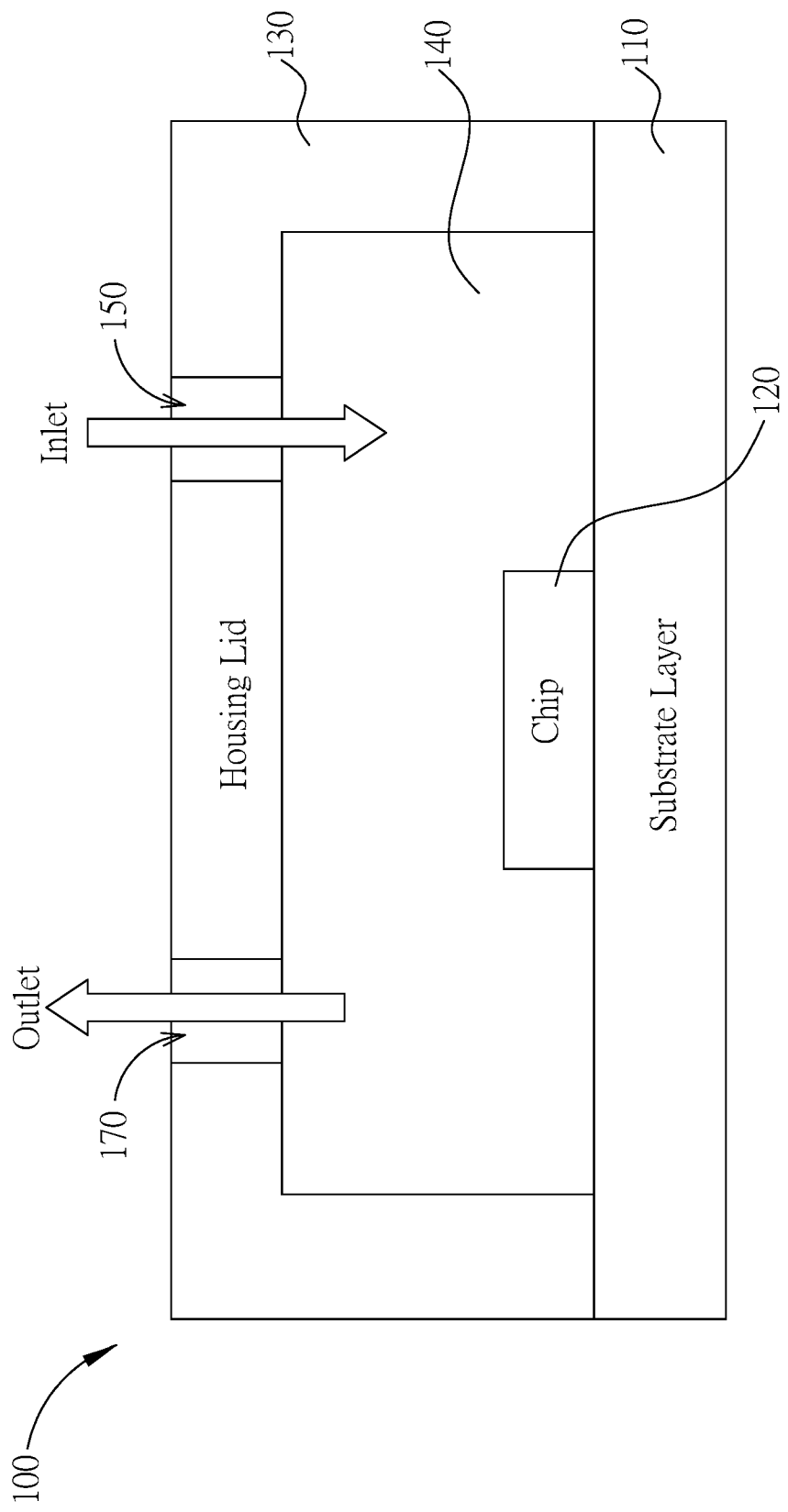
FIG. 4 illustrates at least one inlet hole and/or at least one outlet hole disposed on the housing lid shown in FIG. 1.

In some examples, the housing lid 130 further includes an outlet hole 170, as illustrated in FIG. 4. After the liquid-form TIM flows into the inlet hole 150 and enters the internal space 140, overflow liquid-form TIM inside the internal space 140 can flow out of the internal space 140 via the outlet hole 170. That is, the inlet hole 150, the internal space 140 and the outlet hole 170 form a heat cycle for removing over concentrated heat inside the semiconductor package 100. In this way, the semiconductor package 100 can have a better heat protection.

Figure 5:
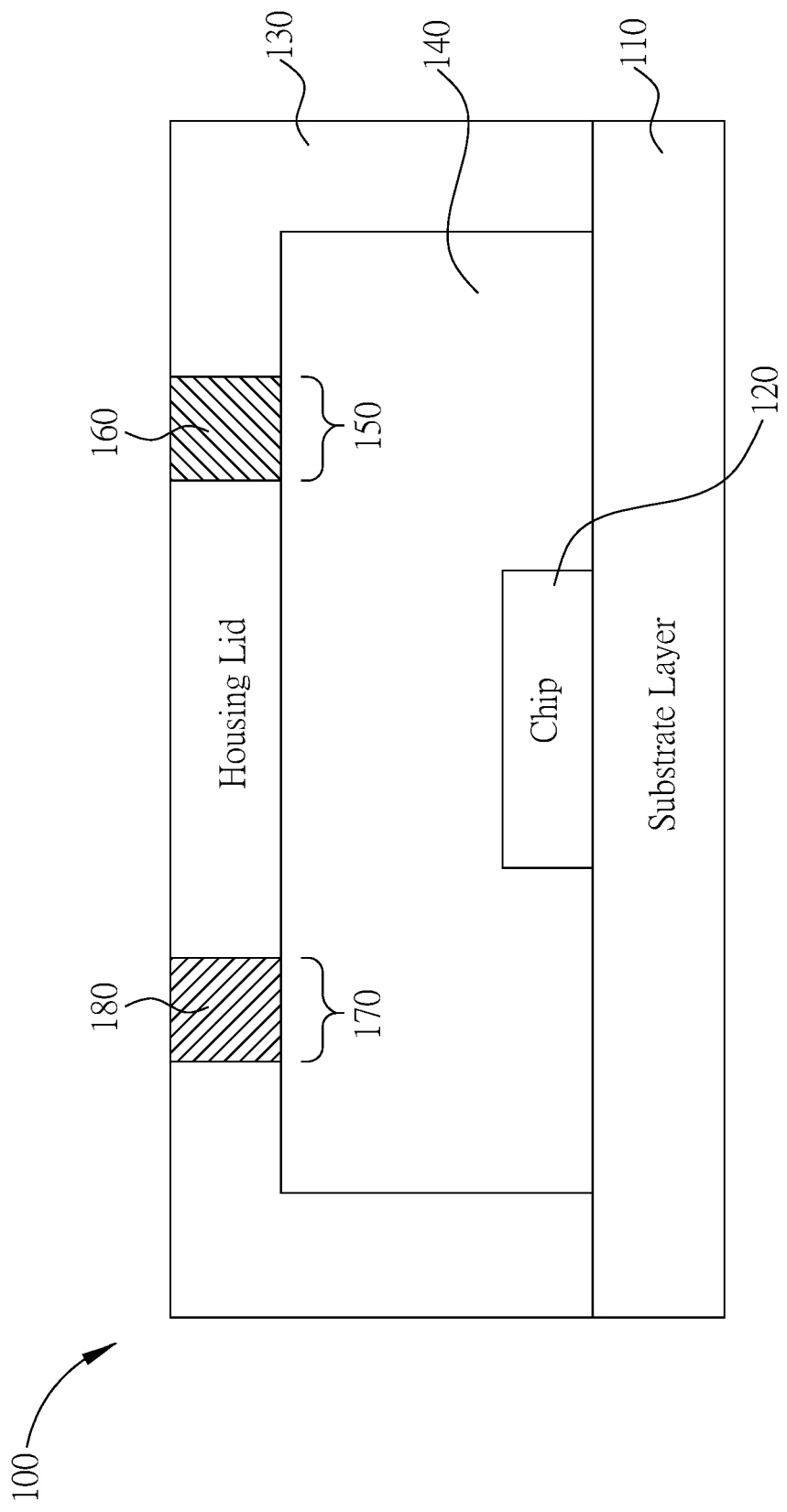
FIG. 5 illustrates at least one inlet plug and/or at least one outlet plug for blocking the at least one inlet hole and/or the at least one outlet hole shown in FIG. 4.

Similarly, in some examples, besides the inlet plug 160, the semiconductor package 100 further includes an outlet plug 180 for blocking the outlet hole 170, as illustrated in FIG. 5. Therefore, the abovementioned heat cycle stops. So, both the inlet plug 160 and the outlet plug 180 seal the liquid-form TIM inside the internal space 140. Such that the liquid-form TIM within the internal space 140 keeps on cooling and solidifying. Also, both the inlet plug 160 and the outlet plug 180 block external liquid-form TIM from flowing into the inlet hole 150 and from flowing out of the outlet hole 170.

Similarly, in some examples, both the inlet plug 160 and the outlet plug 180 are implemented using screws. In addition, both the inlet hole 150 and the outlet hole 170 have lateral threads. Such that the inlet plug 160 screws into the inlet hole 150 for blocking the inlet hole 150, and the outlet plug 180 screws into the outlet hole 160 for blocking the outlet hole 160.

In some examples, the semiconductor package 100 applies various numbers of inlet holes 160 and/or outlet holes 180, according to various requirements of cooling/solidifying the liquid-form TIM sealed within the internal space 140.

Figure 6:
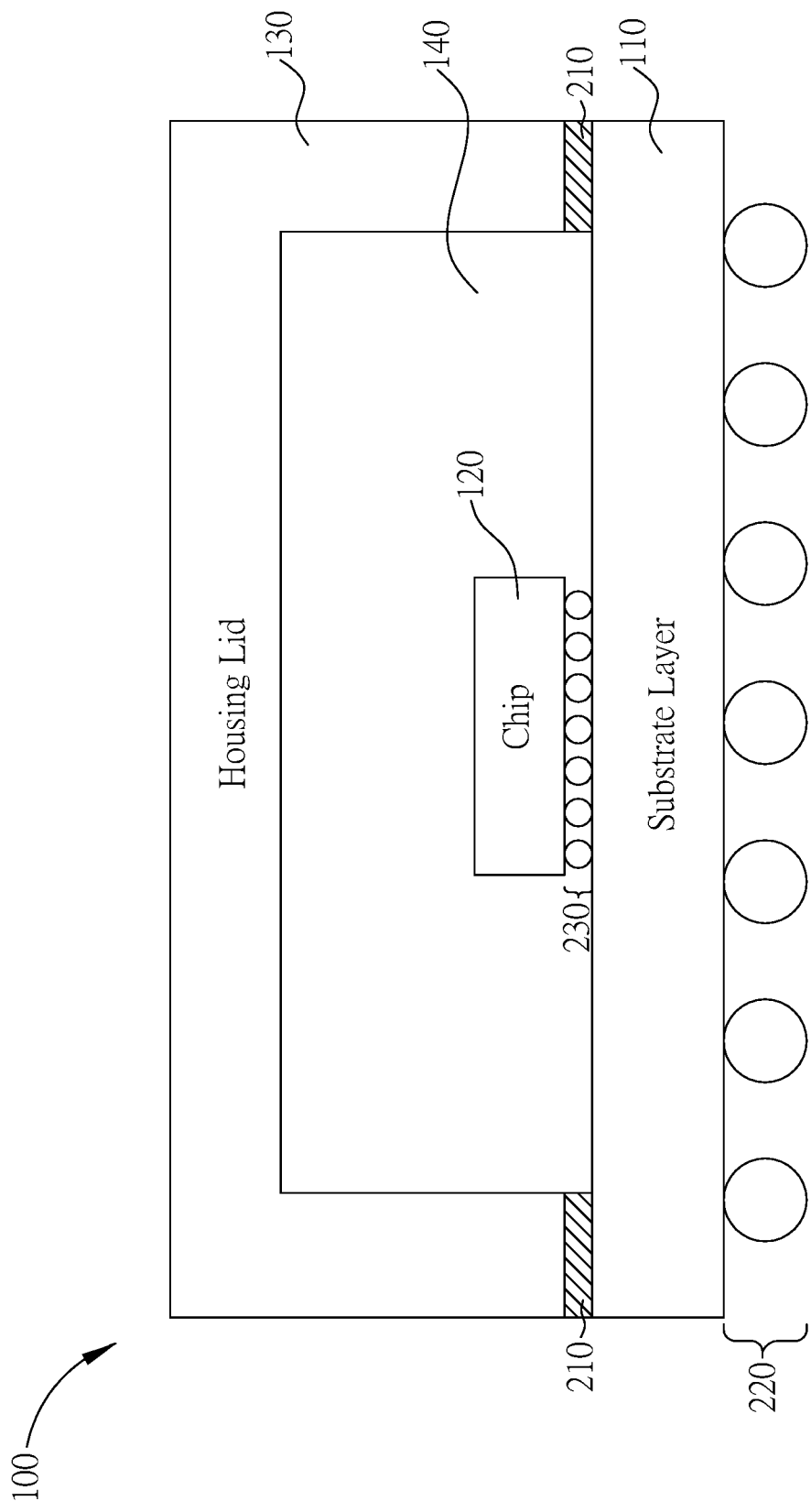
FIG. 6 illustrate at least one adhesive layer and/or at least one solder bump applied on the semiconductor package shown in FIG. 1.

In some examples, the semiconductor package 100 also applies at least one adhesive layer 210, as illustrated in FIG. 6. The at least one adhesive layer 210 is disposed between the housing lid 130 and the substrate layer 110. In this way, the at least one adhesive layer 210 substantially and partially contacts and adheres the housing lid 130 to the substrate layer 110. Such that the housing lid 130 and the substrate layer 110 can form an integral structure and a more compact structure.

In some examples, the semiconductor package 100 applies solder bumps for improving its electronic operations. Optionally, as illustrated in FIG. 6, the semiconductor package 100 applies solder bumps 220 between the substrate layer 110 and an external printed circuit board (PCB). In this way, the substrate layer 110 and the external PCB is electrically coupled via the solder bumps 220. Therefore, the semiconductor package 100 is capable of cooperating with the external PCB. In some examples, the semiconductor package 100 optionally applies solder bumps 230 between the chip 120 and the substrate layer 110, as illustrated in FIG. 6. Such that the chip 120 is electrically coupled to the substrate layer 110 via the solder bumps 230 for required operations.

The present disclosure also introduces a method of fabricating the semiconductor package 100. First, the chip 120 is disposed above the substrate layer 110 to render the chip 120 to be electrically coupled to the substrate layer 110. Second, the housing lid 130 is disposed to cover the chip 120 and the substrate layer 110. Third, the internal space 140 is formed between the housing lid 130, the chip 120 and the substrate layer 110. Last, the liquid-form TIM is filled into the internal space 140. Additionally, after performing an appropriate baking procedure, the liquid-form TIM is solidified within the internal space 140, such that the semiconductor package 110's electronic properties become stable.

In some examples, the inlet hole 150 is additionally drilled on the housing lid 130 for allowing the liquid-form TIM to flow into the internal space 140. Also, the inlet plug 160 is used for blocking the inlet hole 150 to seal the liquid-form TIM within the internal space 140.

Similarly, in some examples, the outlet hole 170 is further drilled on the housing lid 130 for allowing the liquid-form TIM to flow out of the internal space 140. Moreover, the outlet plug 180 is used for blocking the outlet hole 170 for sealing the liquid-form TIM within the internal space 140.

In some examples, the housing lid 130 is at least partially adhered to the substrate layer, e.g., with the aid of the at least one adhesive layer 210.

In some examples, the solder bumps 220 are sandwiched between the substrate layer 110 and the external PCB for enabling mutual electronic operations. Similarly, in some examples, the solder bumps 230 are disposed between the substrate layer 110 and the chip 120 for enabling mutual electronic operations.

A second embodiment of the present disclosure improves the semiconductor package 100's heat-dissipating capability by incorporating additional features in comparison to the first embodiment shown in FIG. 6.

Figure 7:
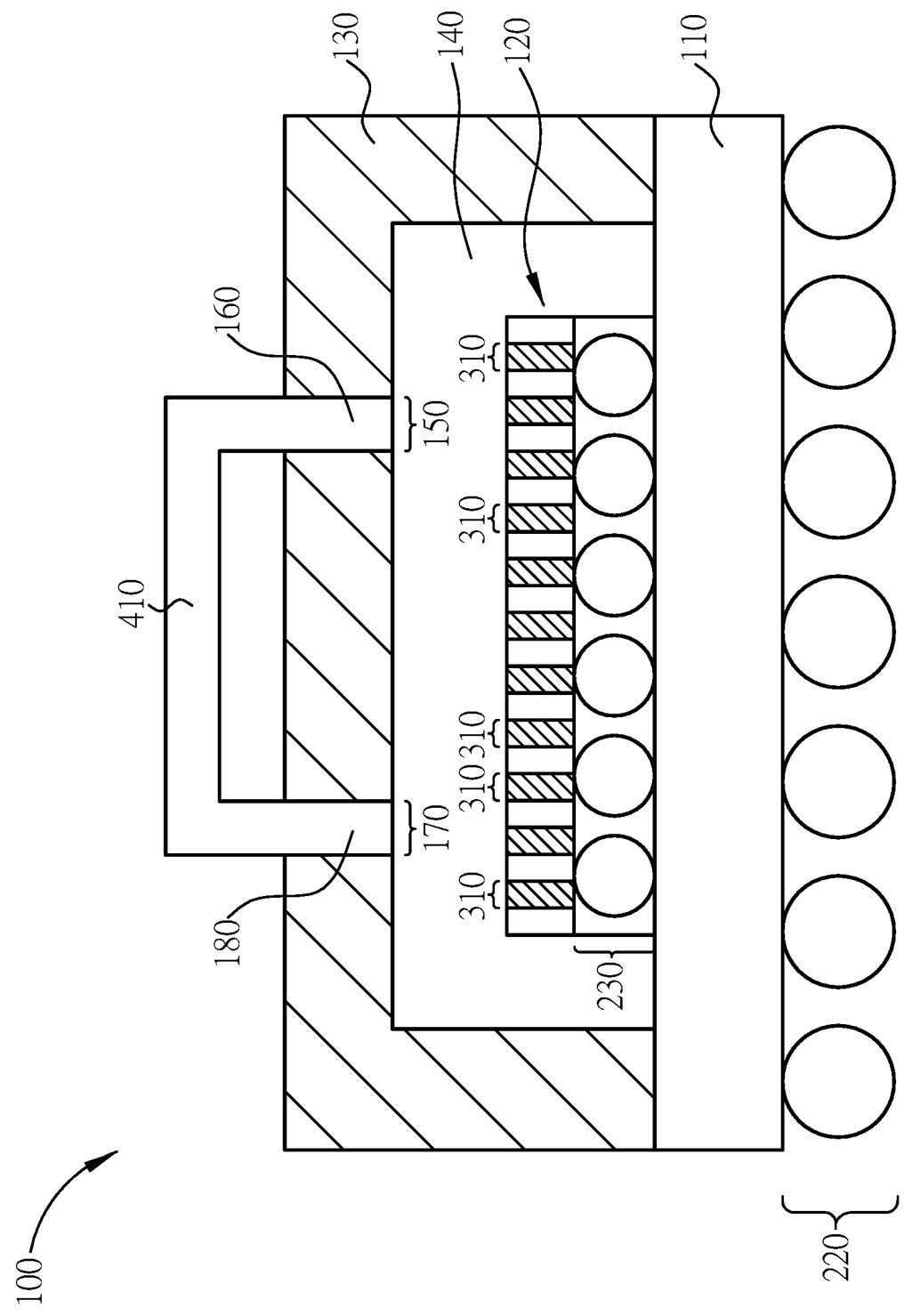
FIG. 7 illustrates a lateral view of an exemplary semiconductor package that includes at least one through silicon via (TSV) according to the second embodiment of the present disclosure.

FIG. 7 illustrates a lateral view of an exemplary semiconductor package 100 according to the second embodiment of the present disclosure. Specifically, in comparison to the first embodiment, the chip 120 further embeds at least one through silicon via (TSV) 310. It is noted that the internal space 140 is filled with thermal-conductive liquid, such that the at least one TSV may also be substantially filled with the thermal-conductive liquid as well. Consequently, heat from the chip 310 and/or even the substrate layer 110 can be more efficiently dissipated with the aid of capillary phenomenon that occurs within the at least one TSV 310.

It is also noted that the solder bumps 230 and/or the adhesive layer 210 are optional in the following embodiments (including the second embodiment), such that they are not necessarily illustrated for brevity.

Figure 8:
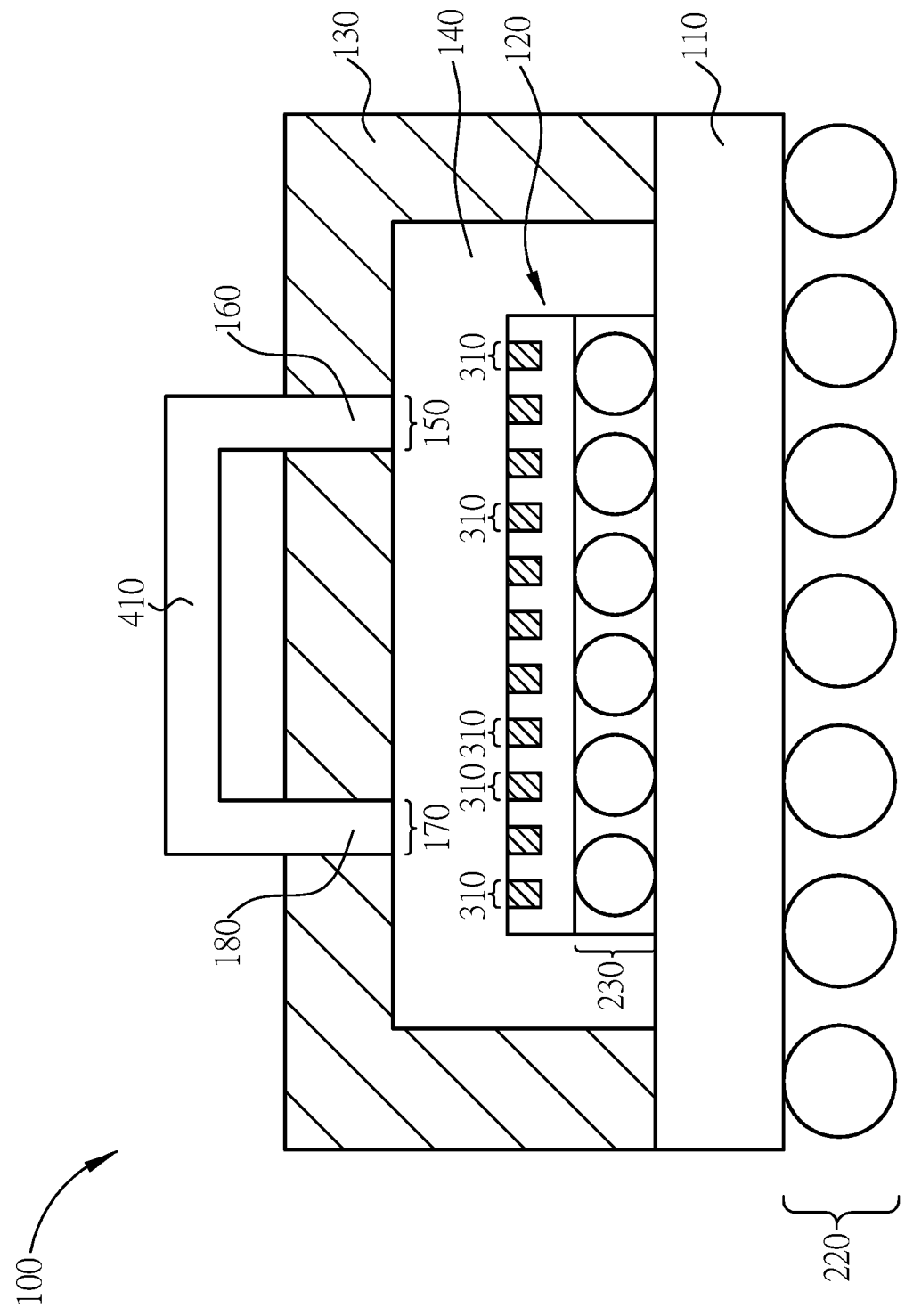
FIG. 8 illustrates a lateral view of an exemplary semiconductor package with at least one TSV that partially penetrate the chip.

In some examples, the at least one TSV 310 may partially or entirely penetrate the chip 120 for introducing different degrees of the capillary phenomenon. In FIG. 7, the at least one TSV entirely penetrates the chip 120. And FIG. 8 illustrates a lateral view of an exemplary semiconductor package 100 with at least one TSV 310 that partially penetrate the chip 120 following the example shown in FIG. 7.

Figure 9:
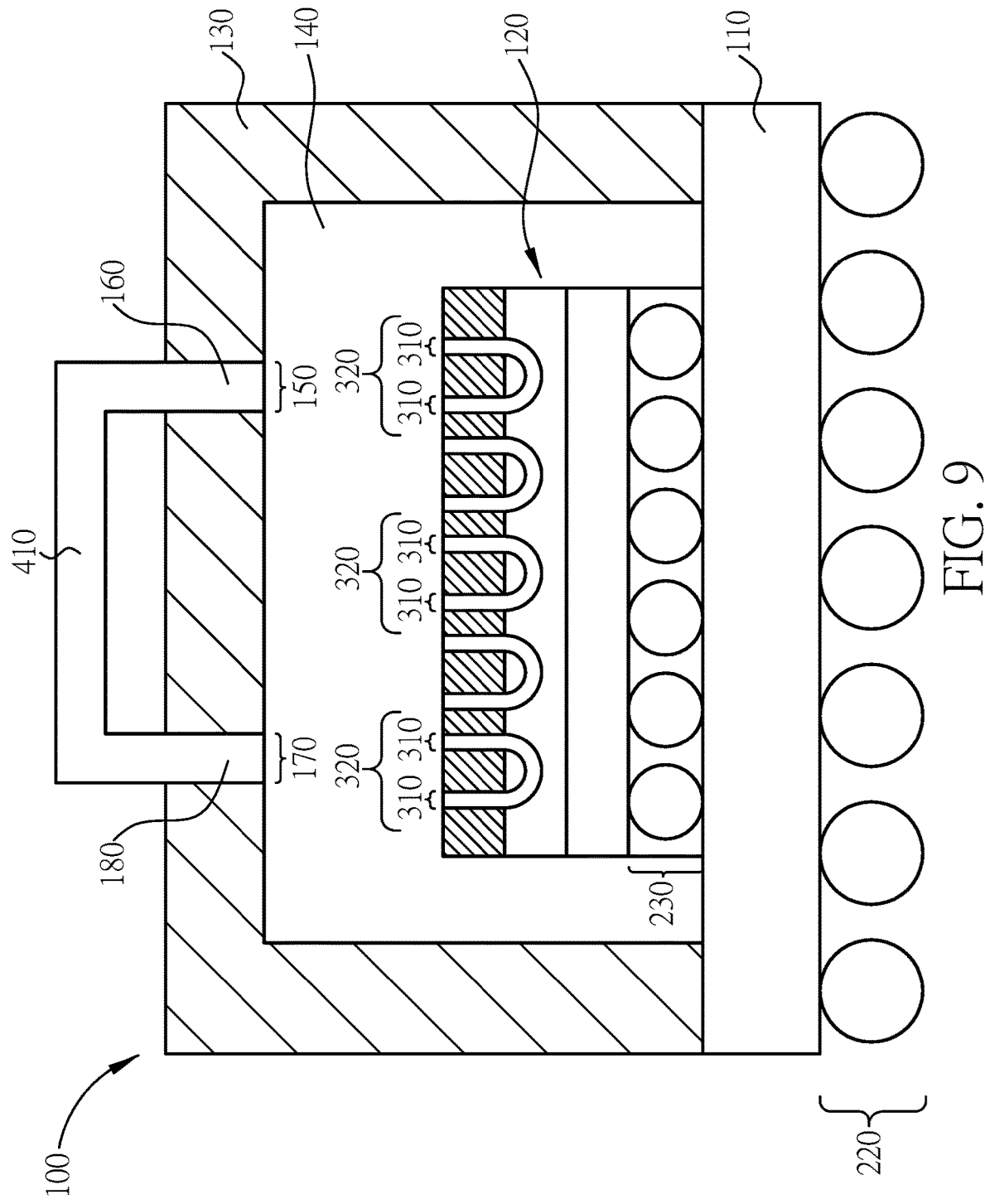
FIG. 9 illustrates a lateral view of an exemplary semiconductor package with at least one pair of TSVs that form a pipe embed within the chip.

In some examples, at least one pair of the at least one TSV 310 additionally form a pipe 320 that embeds within the chip 310 for connecting the pair of TSVs 310. FIG. 9 illustrates a lateral view of the exemplary semiconductor package 100 with at least one pair of TSVs 310 that form a pipe 320 embed within the chip 120. The pipe 320 aids the forementioned capillary effect within the pair of TSVs 310 by more easily driving bubbles out. Such that the capillary effect within the pair of TSVs 310 are more unlikely hindered by the bubbles.

Figure 10:
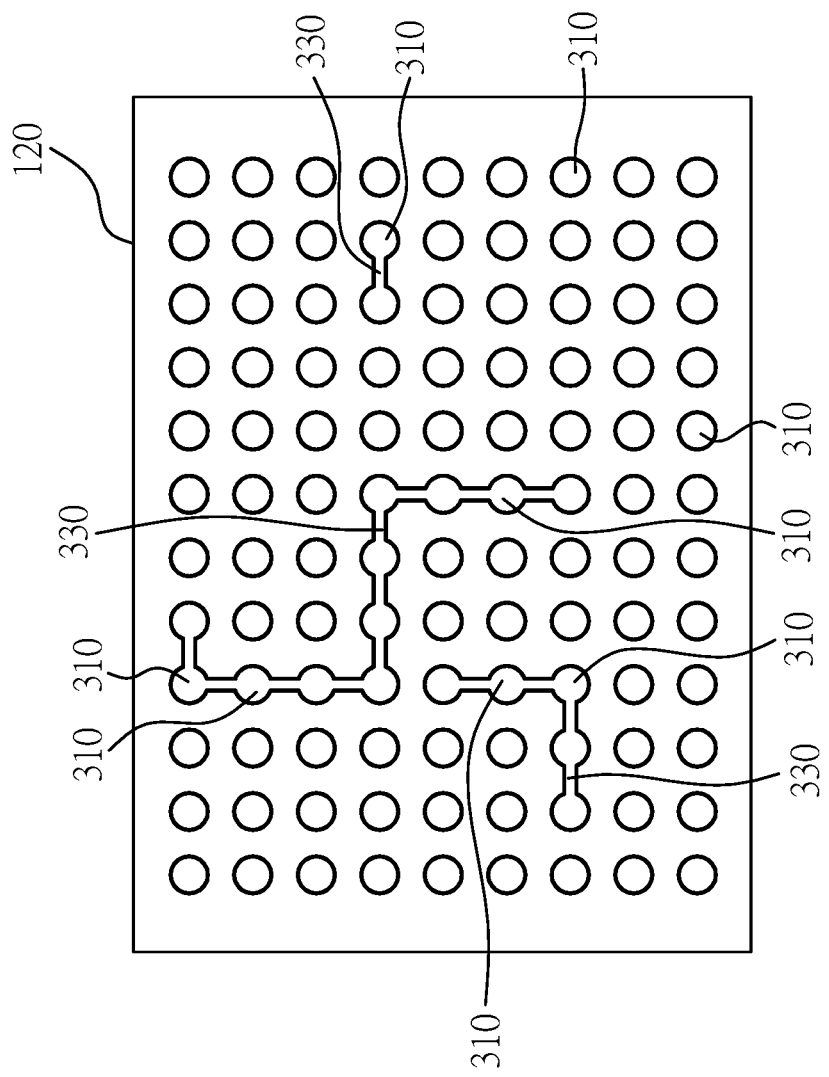
FIG. 10 illustrates a top view of an exemplary semiconductor package with at least one pair of its TSVs connected with a microchannel.

In some examples, the chip 120 further includes at least one microchannel 330 that connects at least one pair of TSVs 310 on its surface. FIG. 10 illustrates a top view of an exemplary semiconductor package 100 with at least one pair of its TSVs 310 connected with a microchannel 310. The microchannel 330 aids in lateral dissipation or cycling of heat, whereas the at least one TSV 310 aids in vertical dissipation or cycling of heat.

In some examples, the thermal-conductive liquid includes Chlorofluorocarbons (CFC) for improving heat-dissipation or heat-cycling within the internal space 140.

In some examples, the housing lid 130 optionally and additionally includes at least one holes and its corresponding plugs for switching on or switching off the heat dissipation or cycling of the semiconductor package 100, for example, the switchable heat-dissipating cycle formed by the inlet hole 150, the inlet plug 160, the outlet hole 170 and the outlet plug 180, as illustrated in FIGS. 2-5. Additionally, in some examples, the inlet plug 160 and the outlet plug 180 can be removed, and an external pipe 410 is added for connecting the inlet hole 150 and the outlet hole 170 at the semiconductor package 100's external side, as shown in FIGS. 7-9. In this way, when heat is extracted from the semiconductor package 100 via the outlet hole 170, the heat can be more efficiently removed via heat conduction at the pipe 410. Moreover, the pipe 410 can be additionally disposed at a cooling environment, e.g., a better air/fluid cooling environment that may has a cooling fan and/or a cooling fluid tank.

Figure 11:
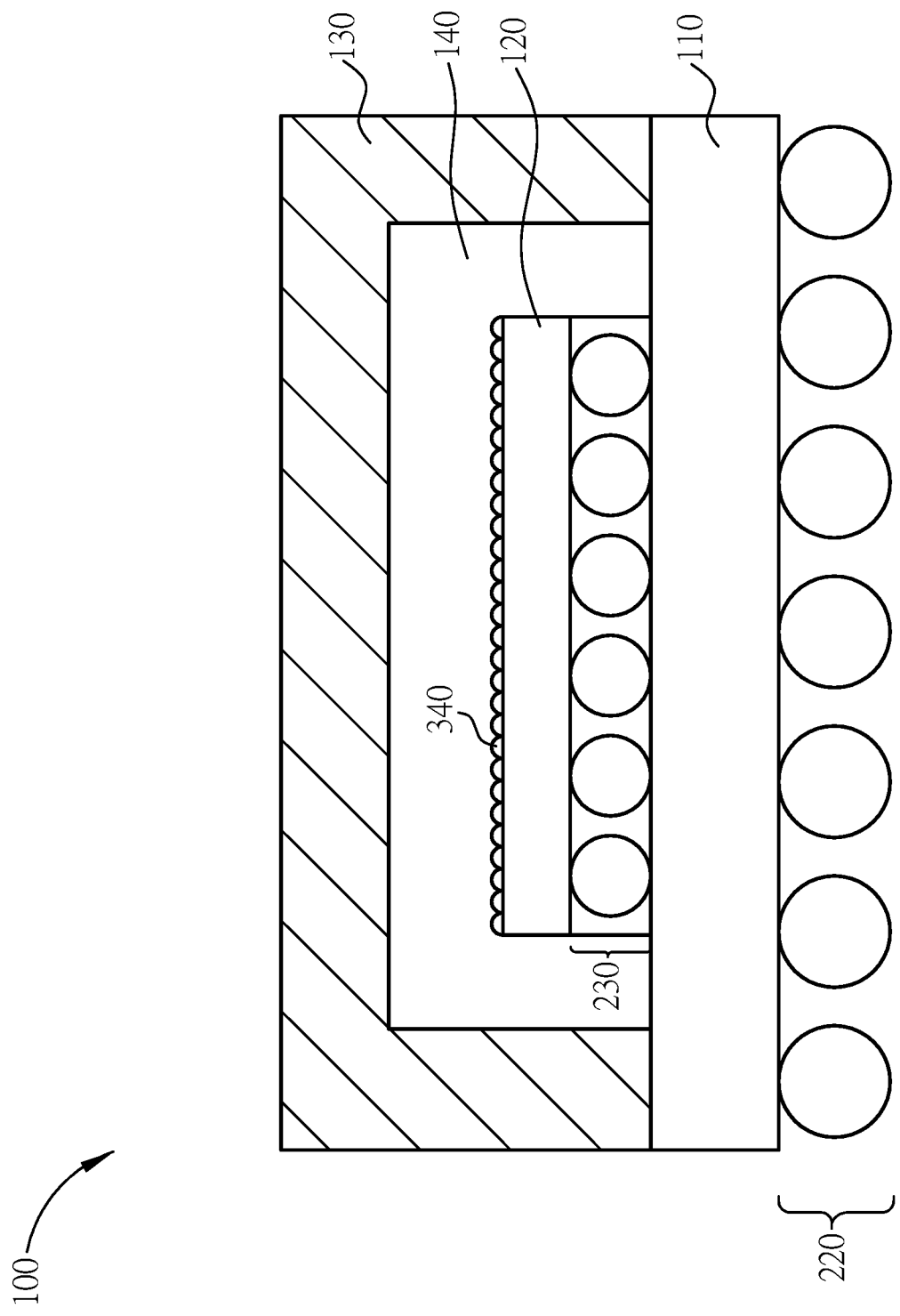
FIG. 11 illustrates a lateral view of an exemplary semiconductor package that has a metal mesh for covering the chip.

In a third embodiment of the present disclosure, the chip 120's surface is covered by a metal mesh 340, as shown in the lateral view of the exemplary semiconductor package 100 in FIG. 11. Therefore, the chip 120's heat is more efficiently conducted via the metal mesh 340 to the internal space 140. In some examples, the metal mesh 340 is made of copper or stainless steel. In some examples, the spacings on the metal mesh 340 is ranged from 0.5 micrometers to 100-200 micrometers.

Figure 12:
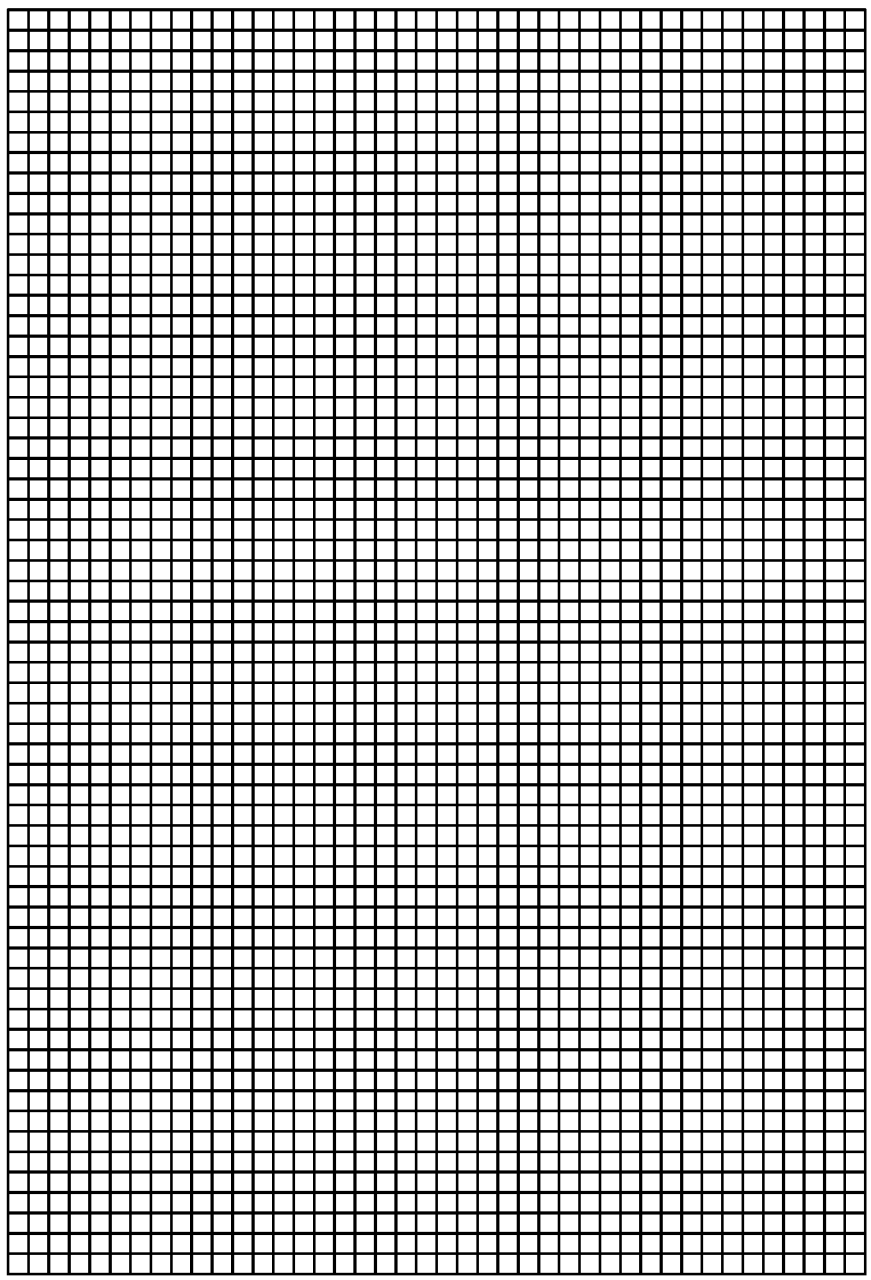
FIG. 12 illustrates a top view of the metal mesh shown in FIG. 11 according to one example.

FIG. 12 illustrates a top view of the metal mesh 340 according to one example. In some examples, the metal mesh 340 can be etched on the chip 120 or be disposed directly above the chip 120.

Figure 13:
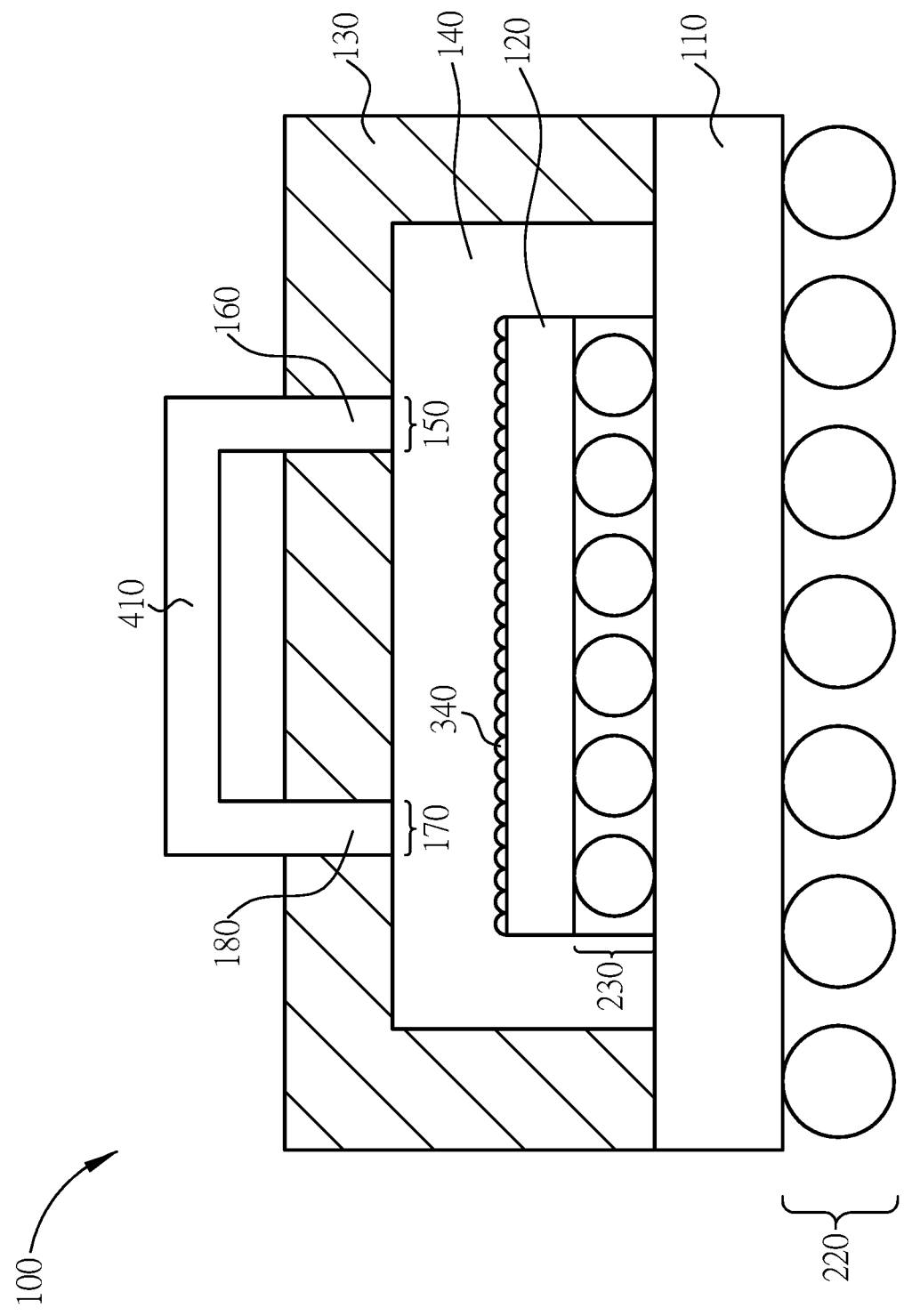
FIG. 13 illustrates a lateral view of the exemplary semiconductor package shown in FIG. 11 that has an external pipe.

FIG. 13 illustrates a lateral view of the exemplary semiconductor package 100 shown in FIG. 11 that has an external pipe 410. With the aid of the pipe 410, the semiconductor package 100 can dissipate its heat more efficiently.

Figure 14:
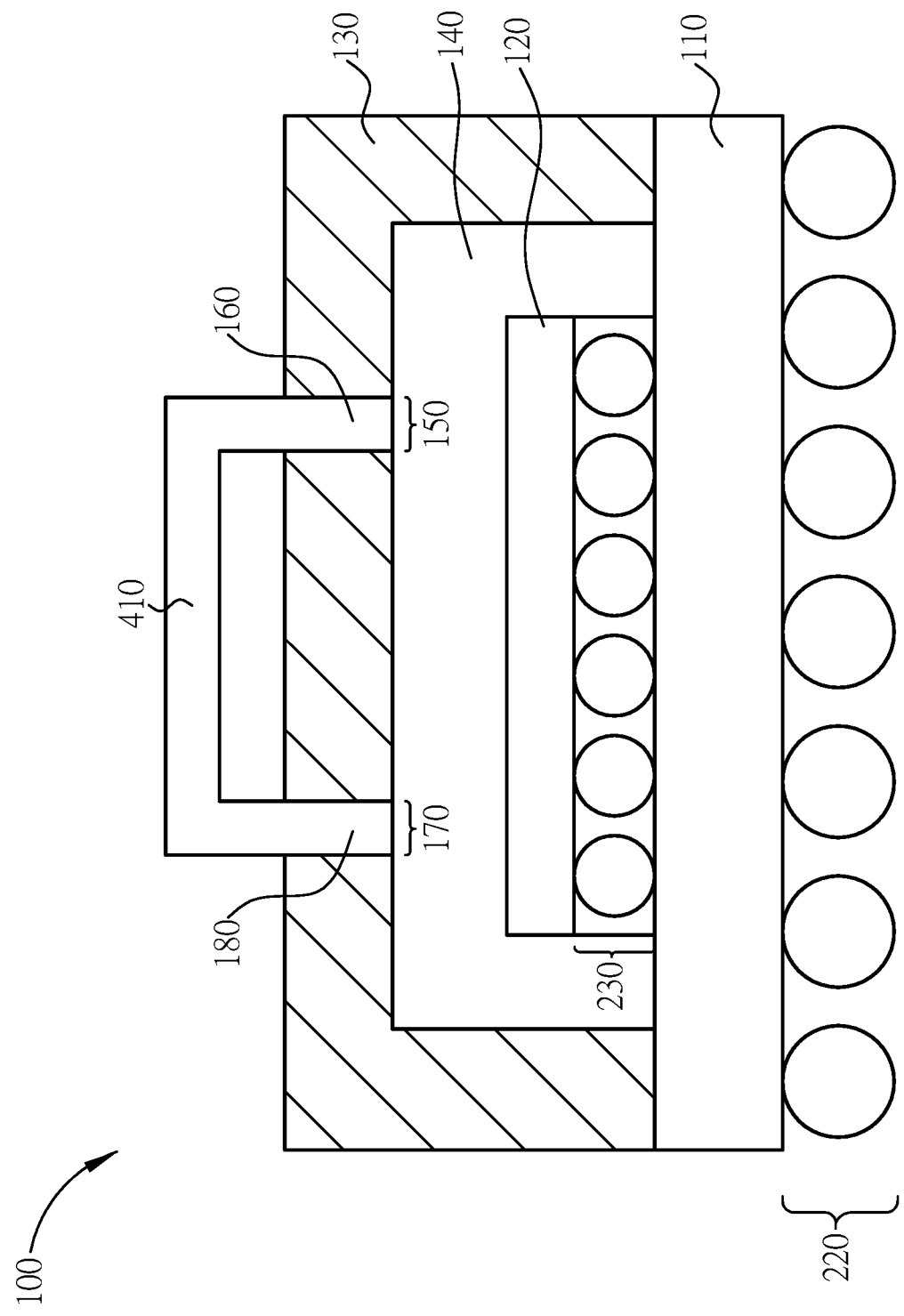
FIG. 14 illustrates an exemplary semiconductor package that directly incorporates an external pipe.

In a fourth embodiment, based on the exemplary semiconductor package 100 shown in FIG. 6, the external pipe 410 may also be incorporated directly for aiding in its heat dissipation, as illustrated in FIG. 14.

Note that the inlet plug 160 and the outlet plug 180 marked in FIGS. 7-9 and 13-14 are substantially removed for enabling the external pipe 410's heat dissipation and cycling.

Features that have been disclosed related FIGS. 1-6 can also be applied in the examples shown in FIGS. 7-14 to form embodiments of the present disclosure. Such that repeated descriptions are skipped for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
   a substrate layer;
   a chip, disposed on the substrate layer and electrically coupled to the substrate layer, wherein the chip comprises at least one through silicon via (TSV);
   a housing lid, disposed above both the substrate layer and the chip, and coupled to the substrate layer at its edge for forming an internal space that encompasses the chip; and
   thermal-conductive liquid, filled within the internal space;
   wherein two of the at least one TSV are configured to form a pipe that embeds within the chip, and the two TSVs are substantially connected to each other.

2. The semiconductor package of claim 1, wherein the at least one TSV is configured to partially penetrate the chip.

3. The semiconductor package of claim 1, wherein the at least one TSV is configured to entirely penetrate the chip.

4. The semiconductor package of claim 1, further comprising:
   at least one microchannel, disposed between two of the at least one TSV on a surface of the chip.

5. The semiconductor package of claim 1, wherein the thermal-conductive liquid comprises Chlorofluorocarbons (CFC).

6. The semiconductor package of claim 1, wherein the housing lid comprises a plurality of holes that penetrate the housing lid, and the plurality of holes are configured to allow the thermal conductive liquid to flow into or flow out of the internal space.

7. The semiconductor package of claim 6, further comprising: a plurality of plugs, which are configured to block the plurality of holes for sealing the thermal conductive liquid within the internal space.

8. The semiconductor package of claim 7, wherein the plurality of plugs comprise a plurality of screws, the plurality of holes comprise a plurality of lateral threads, and the plurality of screws are configured to detachably engage with the plurality of lateral threads for blocking the inlet hole.

9. The semiconductor package of claim 6, wherein the housing lid further comprises:
   at least one cycling pipe, configured to connect a pair of the plurality of holes at an external side of the semiconductor package.

10. The semiconductor package of claim 1, further comprising:
    an adhesive layer, disposed between the housing lid and the substrate layer, and configured to substantially contact both the housing lid and the substrate layer for adhering the housing lid with the substrate layer.

11. The semiconductor package of claim 1, wherein the substrate layer further comprises a plurality of solder bumps, which are disposed between the substrate layer and an external printed circuit board (PCB), such that the substrate layer is electrically coupled to the external PCB via the plurality of solder bumps.

12. The semiconductor package of claim 1, wherein the substrate layer further comprises a plurality of solder bumps, which are sandwiched between the substrate layer and the chip, such that the chip is electrically coupled to the substrate layer via the plurality of solder bumps.

13. A semiconductor package, comprising:
    a substrate layer;
    a chip, disposed on the substrate layer and electrically coupled to the substrate layer, wherein the chip comprises at least one through silicon via (TSV);
    a housing lid, disposed above both the substrate layer and the chip, and coupled to the substrate layer at its edge for forming an internal space that encompasses the chip;
    thermal-conductive liquid, filled within the internal space; and
    at least one microchannel disposed between two of the at least one TSV on a surface of the chip.

14. The semiconductor package of claim 13, further comprising a metal mesh, disposed on the surface of the chip and within the internal space, wherein the metal mesh is made of copper.

15. The semiconductor package of claim 13, further comprising a metal mesh, disposed on the surface of the chip and within the internal space, wherein the metal mesh is made of stainless steel.

16. The semiconductor package of claim 13, wherein the housing lid comprises:
    at least two holes, configured to substantially penetrate the housing lid; and
    at least one cycling pipe, configured to connect a pair of the at least two holes at an external side of the semiconductor package.

17. The semiconductor package of claim 13, wherein the thermal-conductive liquid comprises Chlorofluorocarbons (CFC).

18. The semiconductor package of claim 13, further comprising:

an adhesive layer, disposed between the housing lid and the substrate layer, and configured to substantially contact both the housing lid and the substrate layer for adhering the housing lid with the substrate layer.

19. The semiconductor package of claim 13, wherein the substrate layer further comprises a plurality of solder bumps, which are disposed between the substrate layer and an external printed circuit board (PCB), such that the substrate layer is electrically coupled to the external PCB via the plurality of solder bumps.

20. The semiconductor package of claim 13, wherein the substrate layer further comprises a plurality of solder bumps, which are sandwiched between the substrate layer and the chip, such that the chip is electrically coupled to the substrate layer via the plurality of solder bumps.

* * * * *